United States Patent
Wong et al.

(10) Patent No.: US 7,148,702 B2
(45) Date of Patent: Dec. 12, 2006

(54) VNA AND METHOD FOR ADDRESSING TRANSMISSION LINE EFFECTS IN VNA MEASUREMENT DATA

(75) Inventors: Kenneth H. Wong, Santa Rosa, CA (US); David V. Blackham, Santa Rosa, CA (US); Joel P. Dunsmore, Sebastopol, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/093,456

(22) Filed: Mar. 30, 2005

(65) Prior Publication Data

US 2006/0226856 A1 Oct. 12, 2006

(51) Int. Cl.
*G01R 27/28* (2006.01)
*G01R 27/04* (2006.01)
*G01R 35/00* (2006.01)
*G06F 17/50* (2006.01)

(52) U.S. Cl. ............... 324/650; 324/638; 324/601; 703/14

(58) Field of Classification Search ............... 324/650, 324/638, 601; 703/2
See application file for complete search history.

(56) References Cited

U.S. PATENT DOCUMENTS

| 4,024,460 | A | | 5/1977 | Vifian |
| 5,434,511 | A | | 7/1995 | Adamian et al. |
| 5,715,183 | A | * | 2/1998 | Grace et al. ................ 702/85 |
| 6,300,775 | B1 | * | 10/2001 | Peach et al. ................ 324/601 |
| 6,396,285 | B1 | * | 5/2002 | Blackham .................... 324/601 |
| 6,396,287 | B1 | * | 5/2002 | Kapetanic et al. .......... 324/623 |
| 6,529,844 | B1 | * | 3/2003 | Kapetanic et al. ............ 702/85 |
| 6,643,597 | B1 | * | 11/2003 | Dunsmore ................... 702/104 |
| 6,826,506 | B1 | * | 11/2004 | Adamian et al. ............ 702/118 |
| 2004/0064774 | A1 | * | 4/2004 | Fabry et al. ................ 714/742 |
| 2004/0150411 | A1 | | 8/2004 | Liu et al. |
| 2005/0030047 | A1 | * | 2/2005 | Adamian ..................... 324/650 |

FOREIGN PATENT DOCUMENTS

GB 2273364 6/1994

OTHER PUBLICATIONS

Williams, D., "De-embedding and Unterminating Microwave Fixtures with Nonlinear Least Squares", IEEE Transactions on Microwave Theory and Techniques, vol. 38, No. 7, Jun. 1990, pp. 787-791.
"Agilent Specifying Calibration Standards for the Agilent 8510 Network Analyzer", Application Note 8510-5B 32 pages.
GB Search Report dated Jul. 21, 2006.

* cited by examiner

*Primary Examiner*—Andrew H. Hirshfeld
*Assistant Examiner*—Jeff Natalini

(57) ABSTRACT

In one embodiment, a vector network analyzer (VNA) comprises a plurality of ports for coupling to a device under test (DUT), at least one reference receiver for measuring signals associated with the DUT, and logic for processing measurement data from the at least one reference receiver to compensate for transmission line effects, wherein the logic for processing evaluates a function, of several controllable variables, that is a sum of multiple transmission line models, wherein each of the controllable variables is related to a respective transmission line length associated with a corresponding transmission line model.

22 Claims, 1 Drawing Sheet

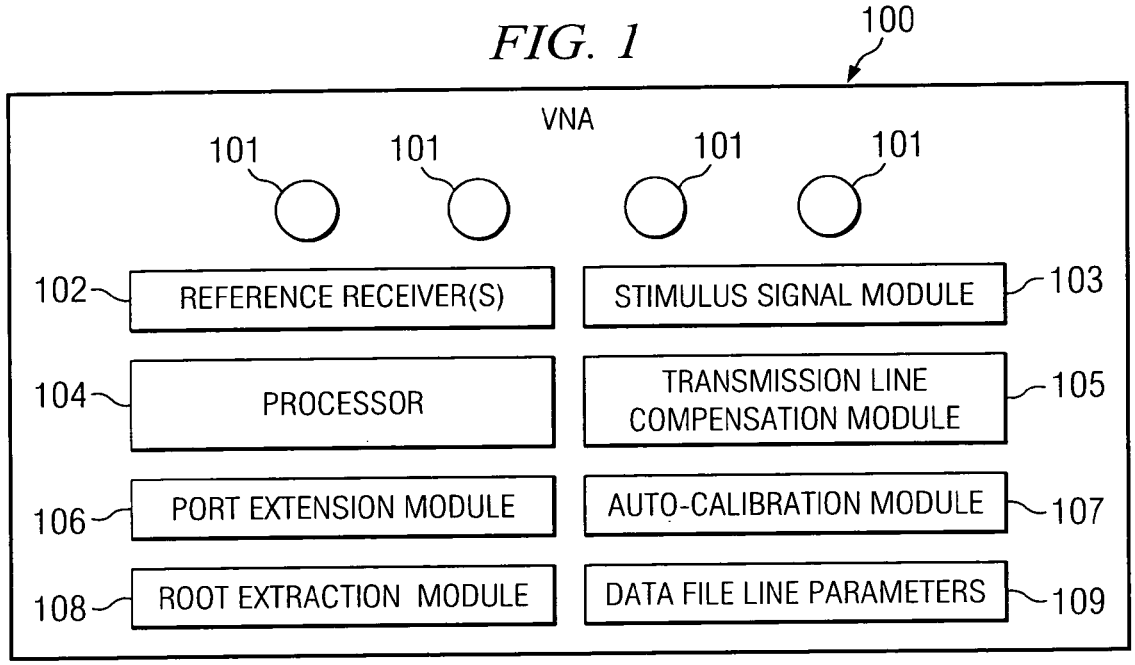
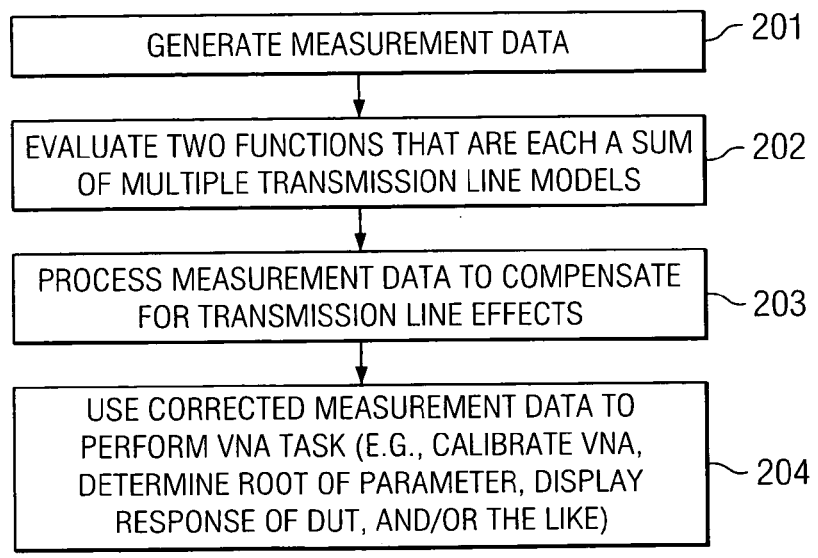

VNA AND METHOD FOR ADDRESSING TRANSMISSION LINE EFFECTS IN VNA MEASUREMENT DATA

TECHNICAL FIELD

The present application is generally related to processing measurement data of VNAs to compensate for the transmission line delay and attenuation.

BACKGROUND

Vector network analyzers (VNAs) are devices that are used to determine the radio frequency (RF) characteristics of various devices under test (DUTs). For a number of VNA operations, the pertinent performance measurements depend upon both the magnitude and phase of the signals applied to and received at each port. However, the delay and attenuation to a DUT may vary on a per port basis. For example, fixture-based test set-ups and "on wafer" set-ups may cause such differences to occur. Specifically, transmission line characteristics can significantly effect the phase and amplitude measurements of a DUT.

Most commercially available VNAs include some functionality to address transmission line effects. An example of such functionality is referred to as "port extensions" that adjust the phase and/or amplitude of measurement data according to an electrical length parameter. Known port extension functionality assumes that a linear relationship exists between the electrical length of a transmission line to the DUT and the delay. However, many transmission lines are dispersive and, hence, their phase characteristics are not linear with respect to frequency. The use of a linear model to compensate for transmission line characteristics can result in significant inaccuracies for higher frequency applications. Another example of such functionality is referred to as "adapter removal" that attempts to remove the magnitude and phase response of an adapter.

SUMMARY

Some representative embodiments are directed to compensating for transmission line effects in VNA measurement data. In some representative embodiments, a suitable module of an VNA calculates loss and/or phase response associated with ports of the VNA and a device under test (DUT). In one embodiment, the module employs functions to calculate transmission line phase response and loss by using respective sums of multiple transmission line models. The multiple models preferably include a coaxial transmission line model, a rectangular waveguide transmission line model, and a microstrip transmission line model. Additionally, the functions are functions of controllable variables that are related to transmission line lengths associated with each of the transmission models.

The processing by the module of the VNA may occur in different contexts. For example, when VNA calibration occurs, parameters defining the transmission line characteristics of a calibration standard may be provided to the module. When calibration measurements are made using the standard, the correction of the measurement data may occur by processing of the module. The greater accuracy in the calibration data enables a greater degree of accuracy in calculating the systematic error terms of the VNA. In another mode of operation, when measurements of a device of interest occurs, the processing of the module may occur to support automatic port extension functionality to enable transmission line effects in measurement data to be addressed in real-time. Also, when adapter removal calibration is appropriate, the transmission phase of the adapter may be computed more accurately to achieve a valid solution.

BRIEF DESCRIPTION OF THE DRAWINGS

FIG. 1 depicts a vector network analyzer according to one representative embodiment.

FIG. 2 depicts a flowchart according to one representative embodiment.

DETAILED DESCRIPTION

In general, the phase response of a transmission line can be modeled as follows:

$$\theta = \frac{-2\pi f \sqrt{\varepsilon_{ref}} L}{c} + \theta_0 \quad (1)$$

where L=length, c=speed of light in a vacuum, and $\varepsilon_{ref}$=effective relative dielectric constant. Let $\delta$=electrical delay=L/c. Then, $\theta = 2\pi f \sqrt{\varepsilon_{ref}} \delta + \theta_0$ The effective relative dielectric constant $\varepsilon_{ref}$ of the transmission media is typically a frequency dependent term and modeled as a function of frequency (G(f)). The phase response of a transmission line can then be modeled by:

$$\theta = 2\pi f \sqrt{G(f)} \delta + \theta_0 \quad (2)$$

The general equation of transmission line loss is given by:

$$IL = \text{transmission loss} = K\, e^{-\alpha l} \quad (3)$$

where $\alpha$=propagation loss constant, l=length of transmission line. Taking the natural log, further derivations may be made as follows:

$$\ln(IL) = -\alpha l + K_0$$

IF $\alpha \cong A^* F(f)$

Then $\ln(IL) = -A^* F(f)^* l + K_0 \quad (4)$

Thus, transmission lines can be characterized by two respective functions (G(f) and F(f)) that define their phase response and loss characteristics.

In some embodiments, the following equations are used to model a low loss single metal coaxial transmission line:

$$G_c(f) = \varepsilon_r;\ F_c(f) = K\sqrt{f} \quad (5)$$

In some embodiments, the following equations are used to model a low loss rectangular waveguide:

$$G_{wg}(f) = \varepsilon_r \left[1 - \left(\frac{f_c}{f}\right)^2\right];\ f_c = \text{waveguide cutoff frequency} \quad (6)$$

$$F_{wg}(f) = \sqrt{\frac{\pi f \mu_0 \rho_c}{b \lambda_0^2}} \left(\sqrt{\frac{\varepsilon_0}{\mu_0}}\right) \left[\frac{1 + \frac{2b}{a}\left(\frac{\lambda_0}{2a}\right)^2}{\sqrt{1 - \left(\frac{\lambda_0}{2a}\right)^2}}\right] \quad (7)$$

In some embodiments, the following equations are used to model a microstrip transmission line:

$$G_{ms}(f) = \varepsilon_r - \frac{\varepsilon_r - \varepsilon_{re}}{1 + \left(\frac{f}{f_p}\right)^m} = \varepsilon_r \left[1 - \frac{1 - \frac{\varepsilon_{re}}{\varepsilon_r}}{1 + \left(\frac{f}{f_p}\right)^m}\right] \quad (8)$$

where $\varepsilon_{re} = F(w, h, t)$; $f_p = H(w, h, t, f)$;
w=width of trace; t=thickness of trace; h=height of trace from ground $F_{ms}(f) = \alpha_c + \alpha_d$ $$\alpha_c = \begin{cases} 1.38 A \frac{R_s}{h Z_{om}} \left(\frac{32 - (w_c/h)^2}{32 + (w_c/h)^2}\right) & w/h \leq 1 \\ 6.1 * 10^{-5} A \frac{R_s Z_{om} \varepsilon_{ref}}{h} \left[(w_c/h) + \frac{0.667(w_c/h)}{(w_c/h) + 1.444}\right] & w/h \geq 1 \end{cases} \quad (9)$$

$$\alpha_d = \begin{cases} 4.34 \left(\frac{1}{v_0} \omega \varepsilon_r \tan(\delta) \frac{\varepsilon_{ref} - 1}{\sqrt{\varepsilon_{ref}(\varepsilon_r - 1)}}\right) & w/h \leq 1 \\ 27.3 \frac{\varepsilon_r}{\varepsilon_r - 1} \left(\frac{\varepsilon_{ref} - 1}{\sqrt{\varepsilon_{ref}}}\right) \left(\frac{\tan(\delta)}{\lambda_0}\right) & w/h \geq 1 \end{cases} \quad (10)$$

$$A = 1 + \frac{h}{w_c}\left[1 + \frac{1.25}{\pi}\ln\left(\frac{2B}{t}\right)\right]; \quad B = \begin{cases} h & w/h \geq \frac{1}{2\pi} \\ 2\pi w & w/h \leq \frac{1}{2\pi} \end{cases} \quad (11)$$

In some embodiments, a module of a VNA employs functions to calculate transmission line delay and loss by using respective sums of the preceding transmission line phase and loss models. In some embodiments, the functions are given by:

$$G(f) = \delta_c G'_c(f) + \delta_{wg} G'_{wg}(f) + \delta_{ms} G'_{ms}(f) + \ldots + G_0$$

$$F(f) = \rho_c F'_c(f) + \rho_{wg} F'_{wg}(f) + \rho_{ms} F'_{ms}(f) + \ldots + F_0 \quad (12)$$

$G_0$, $F_0$=sum of all the offset terms
$G'(f)$, $F'(f)=G(f)$, $F(f)$—offset terms
where
$\rho_x = \alpha_x l_x$; x=propagation loss constant, l=length
$\delta_x = l_x/c$; c=speed of light in vacuum In other embodiments, any combination of transmission line models can be employed. Multiple functions within the summation may also represent the same transmission line type with different physical characteristics. For example, a transmission line of three waveguide segments of differing physical characteristics can be modeled as follows:

$$G(\eta) = \delta_{wg1} G'_{wg1}(f) + \delta_{wg2} G'_{wg2}(f) + \delta_{wg3} G'_{wg3}(f) + \ldots + G_0$$

$$F(\eta) = \rho_{wg1} F'_{wg1}(f) + \rho_{wg2} F'_{wg2}(f) + \rho_{wg3} F'_{wg3}(f) + \ldots + F_0 \quad (13)$$

The summation of the phase and loss functions models test set-ups, test-fixtures, calibration standards, and/or the like as components that comprises respective coaxial, rectangular waveguide, and microstrip segments. The offset terms ($G_0$ and $F_0$) are used to account for phase wrapping and loss for applications that are far from DC and for high pass devices that do not have a solution at DC. Additionally, equations (12) are advantageous, because the coefficients have physical meaning. The coefficients of the phase function (G(f)) are the estimated delays of each transmission line segment. The coefficients of the loss function (F(f)) are related to the estimated loss of each line segment. Upon the determination of the coefficients, equations (12) can then be used in conjunction with equations (2) and (4) to address transmission line phase response and loss associated with VNA measurements. Moreover, given the delay values from the G(f) coefficients, the loss constants of each transmission line segment can be determined. If the propagation loss constants have been determined, length can be determined and used as a cross check against the solution from the G(f) function.

Referring now to the drawings, FIG. 1 depicts VNA 100 according to one representative embodiment. VNA 100 includes conventional elements, such as ports 101, reference receiver(s) 102, and stimulus signal module 103, for generating a stimulus signal, applying the signal to a DUT, and measuring the response of the DUT. VNA 100 may include other conventional elements such as analog-to-digital converters and digital-to-analog converters (not shown). VNA 100 further comprises processor 104 to process measurement data. VNA 100 includes a plurality of software modules defining various processing algorithms. For example, VNA 100 includes auto-calibration module 107 that calculates systematic error terms from measurement data associated with various "standards" (devices having known or estimated characteristics). VNA 100 also includes port extension module 106 that provides phase and amplitude compensation to measurement data associated with a DUT in real-time as a stimulus signal is applied to the DUT. VNA 100 further includes root extraction module 108 for estimating the sign of various parameters (e.g., calibration parameters) that are calculated as the square root of various other values.

Each of modules 106, 107, and 108 achieves a greater degree of accuracy using transmission line compensation module 105. Specifically, when measurement data is obtained (e.g., from a device of interest or a calibration standard), the measurement data is provided to transmission line compensation module 105. Transmission line compensation module 105 uses the offset terms, the coefficients, and equations (2), (4), and (12) to provide phase compensation and amplitude compensation. For example, when calibration procedures occur, transmission line parameters associated with an electronic calibration device may be retrieved from data file 109 and provided to transmission line compensation module 105. As measurement data is generated by applying a stimulus signal to the calibration device, the phase and amplitude corrections are applied to the measurement data by transmission line compensation module 105. Auto-calibration module 107 then calculates systematic error terms using the corrected measurement data.

FIG. 2 depicts a flowchart of operating a VNA according to one representative embodiment. The flowchart of FIG. 2 may be implemented using software instructions and a suitable processor. Additionally or alternatively, integrated circuitry could be employed. In step 201, measurement data is generated by said VNA. In step 202, two functions are evaluated that are each a sum of multiple transmission models. The functions are functions of multiple variables. Each of the multiple variables is related to a respective transmission line length associated with a corresponding transmission line model. One of the functions models the phase response of multiple transmission lines of respective lengths. The other function models the transmission line loss of multiple transmission lines of respective lengths. The functions are evaluated for multiple frequencies of interest. In step 203, the measurement data is processed to compensate for transmission line effects using the values obtained in step 202. In step 204, the corrected measurement data is used to perform one or several VNA tasks (such as to calibrate the VNA, to determine a root of an appropriate parameter, to calculate a response of a DUT, and/or the like).

Some representative embodiments may provide a number of advantages. For example, calibration methods that rely on accurate phase information (e.g. TRL, unknown thru, offset load, adapter removal, and/or the like) will exhibit improved performance. Additionally, some representative embodiments do not exhibit issues associated with computational round-off errors as would occur if higher order polynomial solutions were applied.

What is claimed is:

1. A vector network analyzer (VNA), comprising:
    a plurality of ports for coupling to a device under test (DUT);
    at least one reference receiver for measuring signals associated with said DUT; and
    logic for processing measurement data from said at least one reference receiver to compensate for transmission line effects, wherein said logic for processing evaluates a function, of several controllable variables, that is a sum of multiple transmission line models, wherein each of said controllable variables is related to a respective transmission line length associated with a corresponding transmission line model.

2. The VNA of claim 1 wherein said function calculates a transmission line loss that occurs between at least one of said plurality of ports and said DUT.

3. The VNA of claim 1 wherein said function calculates an amount of transmission line delay that occurs between at least one of said plurality of ports and said DUT.

4. The VNA of claim 1 wherein said function calculates the amount of transmission delay that occurs within an adapter.

5. The VNA of claim 1 wherein one of said transmission line models is a coaxial transmission line model.

6. The VNA of claim 5 wherein said coaxial transmission line model is characterized by the following equation:

$$G_c(f) = \epsilon_r.$$

7. The VNA of claim 5 wherein said coaxial transmission line model is characterized by the following equation:

$$F_c(f) = K\sqrt{f}.$$

8. The VNA of claim 1 wherein one of said transmission line models is a rectangular waveguide transmission line model.

9. The VNA of claim 8 wherein said rectangular waveguide transmission line model is characterized by the following equation:

$$G_{wg}(f) = \varepsilon_r \left[ 1 - \left(\frac{f_c}{f}\right)^2 \right].$$

10. The VNA of claim 8 wherein said rectangular waveguide transmission line model is characterized by the following equation:

$$F_{wg}(f) = \sqrt{\frac{\pi f \mu_0 \rho_c}{b \lambda_0^2}} \left( \sqrt{\frac{\varepsilon_0}{\mu_0}} \right) \left[ \frac{1 + \frac{2b}{a}\left(\frac{\lambda_0}{2a}\right)^2}{\sqrt{1 - \left(\frac{\lambda_0}{2a}\right)^2}} \right].$$

11. The VNA of claim 1 wherein one of said transmission line models is microstrip transmission line model.

12. The VNA of claim 11 wherein said microstrip transmission line model is characterized by the following equation:

$$G_{ms}(f) = \left[ 1 - \frac{1 - \frac{\varepsilon_{re}}{\varepsilon_r}}{1 + \left(\frac{f}{f_p}\right)^m} \right].$$

13. The VNA of claim 11 wherein said microstrip transmission line model is characterized by the following equations:

$$F_{ms}(f) = \alpha_c + \alpha_d$$

$$\alpha_c = \begin{cases} 1.38 A \frac{R_s}{h Z_{om}} \left( \frac{32 - (w_c/h)^2}{32 + (w_c/h)^2} \right) & w/h \le 1 \\ 6.1 * 10^{-5} A \frac{R_s Z_{om} \varepsilon_{ref}}{h} \left[ (w_c/h) + \frac{0.667(w_c/h)}{(w_c/h) + 1.444} \right] & w/h \ge 1 \end{cases}$$

$$\alpha_d = \begin{cases} 4.34 \left( \frac{1}{v_0} \omega \varepsilon_r \tan(\delta) \frac{\varepsilon_{ref} - 1}{\sqrt{\varepsilon_{ref}(\varepsilon_r - 1)}} \right) & w/h \le 1 \\ 27.3 \frac{\varepsilon_r}{\varepsilon_r - 1} \left( \frac{\varepsilon_{ref} - 1}{\sqrt{\varepsilon_{ref}}} \right) \left( \frac{\tan(\delta)}{\lambda_0} \right) & w/h \ge 1 \end{cases}.$$

14. A method of operating a vector network analyzer (VNA), comprising:
    generating measurement data by said VNA;
    evaluating a function that is a sum of multiple transmission models using multiple variables, wherein each of said multiple variables is related to a respective transmission line length associated with a corresponding transmission line model;
    processing said measurement data in response to said evaluating; and
    compensating for transmission line effects in subsequent measurements by said VNA.

15. The method of claim 14 wherein said processing comprising:
    performing amplitude compensation upon said measurement data.

16. The method of claim 14 wherein said processing comprises:
    providing phase compensation to said measurement data.

17. The method of claim 14 wherein said multiple transmission line models include a coaxial transmission line model, a rectangular waveguide transmission line model, and a microstrip transmission line model.

18. The method of claim 14 wherein said multiple transmission line models include multiple models with different physical characteristics.

19. A system, comprising:
    means for generating a stimulus signal for application to a device under test (DUT);
    means for applying said signal to said DUT;
    means for measuring signals associated with said DUT; and
    means for processing measurement data from said means for measuring to compensate for transmission line effects, wherein said means for processing evaluates a function, of several controllable variables, that is a sum of multiple transmission line models, wherein each of said controllable variables is related to a respective transmission line length associated with a corresponding transmission line model.

20. The system of claim 19 wherein said means for processing performs amplitude compensation upon said measurement data.

21. The system of claim 19 wherein said means for processing provides phase compensation to said measurement data.

22. The system of claim 19 wherein said multiple transmission line models include a coaxial transmission line model, a rectangular waveguide transmission line model, and a microstrip transmission line model.

* * * * *